(12) United States Patent
Kong et al.

(10) Patent No.: US 12,256,487 B2
(45) Date of Patent: Mar. 18, 2025

(54) HYBRID BOARDS WITH EMBEDDED PLANES

(71) Applicant: Intel Corporation, Santa Clara, CA (US)

(72) Inventors: Jackson Chung Peng Kong, Tanjung Tokong (MY); Bok Eng Cheah, Gelugor (MY); Jenny Shio Yin Ong, Bayan Lepas (MY); Seok Ling Lim, Kulim (MY); Chin Lee Kuan, Pahang (MY); Tin Poay Chuah, Bayan Baru (MY)

(73) Assignee: Intel Corporation, Santa Clara, CA (US)

( * ) Notice: Subject to any disclaimer, the term of this patent is extended or adjusted under 35 U.S.C. 154(b) by 743 days.

(21) Appl. No.: 17/367,674

(22) Filed: Jul. 6, 2021

(65) Prior Publication Data

US 2021/0410273 A1    Dec. 30, 2021

(51) Int. Cl.
*H05K 1/02*    (2006.01)
*H05K 3/46*    (2006.01)

(52) U.S. Cl.
CPC ........ *H05K 1/0218* (2013.01); *H05K 3/4688* (2013.01); *H05K 2201/0187* (2013.01); *H05K 2201/093* (2013.01); *H05K 2201/09536* (2013.01)

(58) Field of Classification Search
CPC ............... H05K 1/0218; H05K 3/4688; H05K 2201/0187; H05K 2201/093; H05K 2201/09536
USPC ...................................... 361/762; 156/308.2
See application file for complete search history.

(56) References Cited

U.S. PATENT DOCUMENTS

| | | | | |
|---|---|---|---|---|
| 6,373,717 B1* | 4/2002 | Downes, Jr. | ......... | H05K 3/4641 174/262 |
| 6,764,748 B1* | 7/2004 | Farquhar | ............... | H05K 3/4617 428/209 |
| 7,059,049 B2* | 6/2006 | Farquhar | ............... | H05K 3/4608 361/795 |
| 7,981,245 B2* | 7/2011 | Egitto | ................... | H05K 3/4632 156/308.2 |
| 2003/0147227 A1* | 8/2003 | Egitto | ................... | H05K 3/4641 361/795 |
| 2022/0068843 A1* | 3/2022 | Lim | ........................ | H01L 23/14 |

* cited by examiner

*Primary Examiner* — Timothy J Thompson
*Assistant Examiner* — Michael F McAllister
(74) *Attorney, Agent, or Firm* — Viering, Jentschura & Partner mbB

(57) ABSTRACT

The present disclosure is directed to a hybrid dielectric interconnect stack for a printed circuit board having a first dielectric layer with a first dielectric constant and a first dielectric loss tangent positioned over an intermediate layer, which includes a first dielectric sublayer with a first sublayer dielectric constant and a first sublayer dielectric loss tangent, an embedded conductive layer, and a second dielectric sublayer with a second sublayer dielectric constant and a second sublayer dielectric loss tangent, in which the embedded conductive layer is positioned between the first and second dielectric sublayers, and a second dielectric layer with a second dielectric constant and a second dielectric loss tangent, in which the intermediate layer is positioned between the first and second dielectric layers.

20 Claims, 14 Drawing Sheets

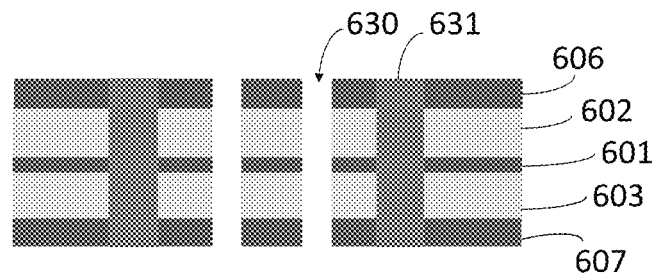
FIG. 6D
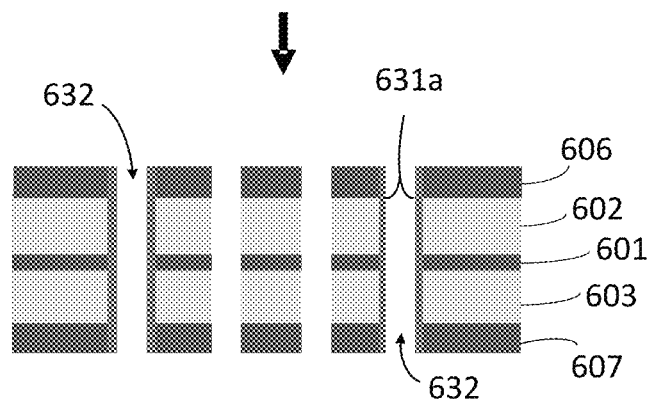
FIG. 6E
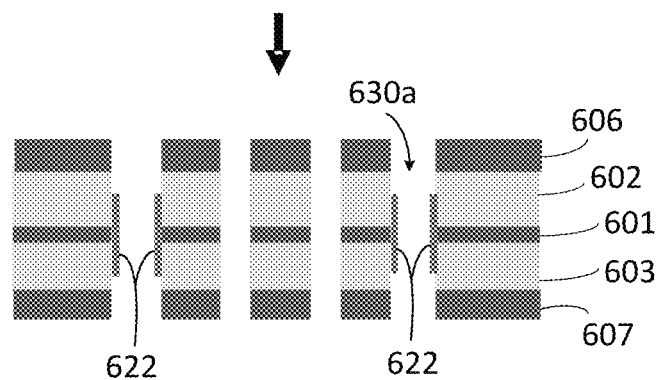
FIG. 6F

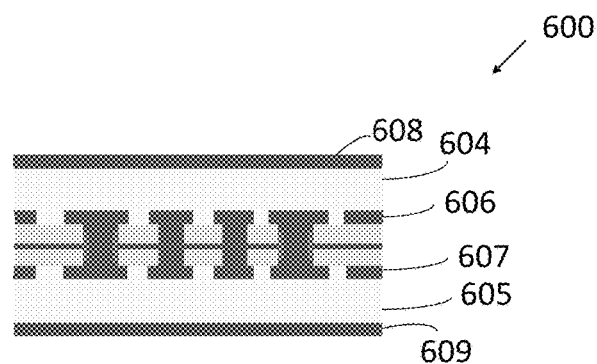
FIG. 6J
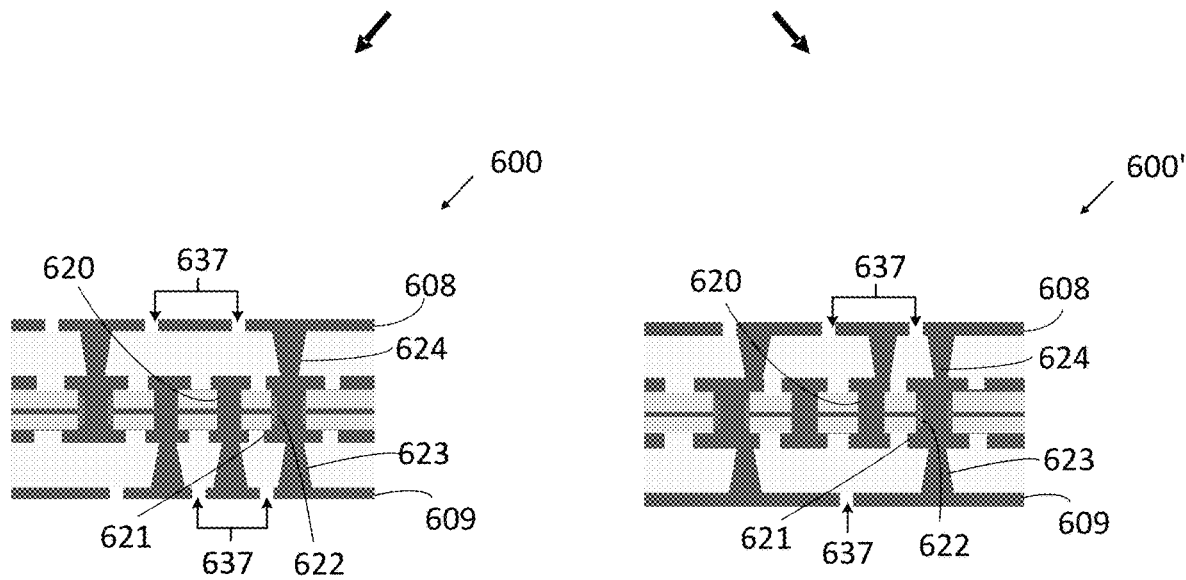
FIG. 6K
FIG. 6K'

HYBRID BOARDS WITH EMBEDDED PLANES

BACKGROUND

With the continued miniaturization and use of more powerful semiconductor devices, the interconnects for semiconductor devices need to provide high signal speeds and power integrity performance. For signal integrity, designers try to achieve minimized attenuation loss of a transmission line to an electrical specification and to achieve good power integrity, the power delivery network should have the lowest impedance/resistance possible. Signal integrity is affected by crosstalk noise, which refers to the unintentional coupling of activity between two or more signals caused by the capacitive coupling between neighboring signals lines on an electronic package or circuit board. The goal is to improve signal insertion losses, control crosstalk coupling noise, and/or power delivery with minimized printed circuit board (PCB) layer count requirements.

A current approach for improved signal integrity includes increasing the PCB layer count, e.g., using ground voltage reference planes that are adjacent to high-speed signal routing layers. Shielding in high-speed digital circuits is an effective and common way to reduce crosstalk noise and signal delay uncertainty. A common method of shielding is placing ground traces and/or planes adjacent to a signal line to reduce noise and delay uncertainty for enhanced current return path and/or signal crosstalk noise coupling control.

Other approaches for improved signal integrity include reducing the circuit board dielectric layer thickness in an interconnect trace stackup geometry, implementation of signal retimer or redriver electronic components, and for power delivery, the use of increased silicon metal-in-metal (MIM) capacitance and package and/or platform level decoupling component count, e.g., silicon capacitors, ceramic capacitors for power delivery network peak impedance ($Z_{PDN}$) suppression. However, increasing the PCB layer count, using electronic components (e.g., retimer/redriver) and other approaches for improved signal/power integrity and IO data-rate scaling involve platform z-height and circuit board form-factor trade-off that present challenges to device miniaturization.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which:

FIGS. 6A through 6L and 6L' show cross-section views of hybrid dielectric interconnect stacks with embedded conductive layers in exemplary process steps according to the present disclosure;

DETAILED DESCRIPTION

Figure 1:
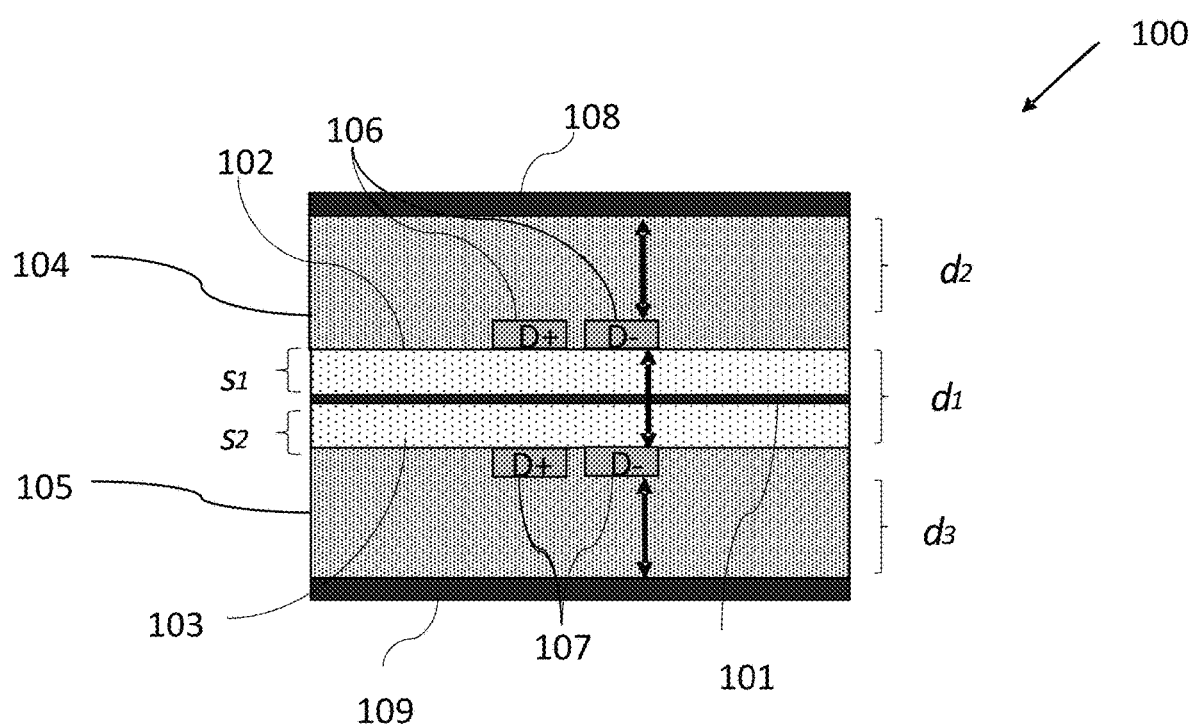
FIG. 1 shows a cross-section view of an exemplary interconnect stack with an embedded voltage reference plane according to the present disclosure.

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

The present disclosure is directed to a hybrid dielectric interconnect stack for a printed circuit board having a first dielectric layer with a first dielectric constant and a first dielectric loss tangent positioned over an intermediate layer. The intermediate layer includes a first dielectric sublayer with a first sublayer dielectric constant and a first sublayer dielectric loss tangent, an embedded conductive layer, and a second dielectric sublayer with a second sublayer dielectric constant and a second sublayer dielectric loss tangent, in which the embedded conductive layer is positioned between the first and second dielectric sublayers.

In an aspect, the present hybrid dielectric interconnect stack for printed circuit boards, or other substrates, includes a second dielectric layer with a second dielectric constant and a second dielectric loss tangent, in which the intermediate layer is positioned between the first and second dielectric layers, a first conductive signal line at a top surface of the intermediate layer, in which the first conductive signal line is covered by the first dielectric layer, and a second conductive signal line at a bottom surface of the intermediate layer, in which the second conductive signal line is covered by the second dielectric layer, in which at least one of the first sublayer dielectric constant and the first sublayer dielectric loss tangent of the first dielectric sublayer and the second sublayer dielectric constant and the second sublayer dielectric loss tangent of the second dielectric sublayer being lower in value than the first dielectric constant and the first dielectric loss tangent of the first dielectric layer and the second dielectric constant and the second dielectric loss tangent of the second dielectric layer.

In another aspect, the present hybrid dielectric interconnect stack for printed circuit boards, or other substrates, includes a second dielectric layer with a second dielectric constant and a second dielectric loss tangent, in which the intermediate layer is positioned between the first and second dielectric layers, a first sublayer ground plane a top surface of the intermediate layer, in which the first conductive signal line is covered by the first dielectric layer, and a second sublayer ground plane at a bottom surface of the intermediate layer, in which the second conductive signal line is covered by the second dielectric layer, in which the embedded conductive layer is a power supply reference plane.

It is understood that the dielectric loss tangent of a material denotes quantitatively dissipation of the electrical energy due to different physical processes such as electrical conduction, dielectric relaxation, dielectric resonance, and loss from non-linear processes.

A technical advantage of the present disclosure includes, without limitation, improved signal integrity performance, i.e., attenuation loss reduction for differential buses, through the use of low-loss dielectric layers and improved crosstalk coupling noise shielding for single-ended and other interconnects through improved signal current return path using with embedded voltage reference plane(s).

Another technical advantage of the present disclosure includes, without limitation, improved power integrity performance, e.g., reduced impedance loadline and Vmin performance, through reduced AC loop inductance.

A further technical advantage of the present disclosure includes, without limitation, improved platform miniaturization through improved I/O routing density, e.g., DDR memory buses ascribed to reduced dielectric thickness.

An additional technical advantage of the present disclosure includes, without limitation, improved z-height scaling of printed circuit boards through signal reference plane count reductions.

To more readily understand and put into practical effect the present hybrid dielectric interconnect layers for use with printed circuit boards, particular aspects will now be described by way of drawings providing examples that are not intended as limitations. The advantages and features of the aspects herein disclosed will be apparent through reference to the following descriptions relating to the accompanying drawings. Furthermore, it is to be understood that the features of the various aspects described herein are not mutually exclusive and can exist in various combinations and permutations. For the sake of brevity, duplicate descriptions of features and properties may be omitted.

FIG. 1 shows a cross-section view of an exemplary interconnect stack for a printed circuit board 100 with an embedded conductive layer 101 with improved signal integrity performance and device miniaturization according to the present disclosure. The embedded conductive layer 101 may have a first dielectric sublayer 102 over a top surface and a second dielectric sublayer 103 under a bottom surface of the embedded conductive layer 101, which act to "embed" the conductive layer. According to the present disclosure, the combination of the first dielectric sublayer 102, the embedded voltage reference plane 101, and the second dielectric sublayer 103 constitute an "intermediate" layer. As shown in FIG. 1, the embedded conductive layer 101 may be an embedded voltage reference plane 101. In FIG. 1, the intermediate layer has a thickness $d_1$, with the first dielectric sublayer 102 having a thickness $s_1$, and the second dielectric sublayer 103 having a thickness $s_2$.

In this aspect shown in FIG. 1, a plurality of signal conductors 106 and 107, e.g., high-speed differential pair signal conductors (D+/D−) for Peripheral Component Interconnect Express 6 (PCIe6) with operating data-rate at 64 Gbps or Serializer/Deserializer (SerDes) interface with operating data-rate from 112 Gbps to 448 Gbps, are disposed on a top surface of the first dielectric sublayer 102 and under a bottom surface of the second dielectric sublayer 103. The first signal conductors 106 are covered by a first dielectric layer 104 positioned over the first dielectric sublayer 102 and the second signal conductors 107 are covered by a second dielectric layer 105 positioned over the second dielectric sublayer 103. In addition, a first ground (Vss) plane 108 may be disposed on a top surface of the first dielectric layer 104 and a second ground (Vss) plane 109 may be disposed under a bottom surface of the second dielectric 105.

It is within the scope of the present disclosure to select suitable dielectric materials with the appropriate Dk/Df values for each of a first dielectric sublayer, a second dielectric sublayer, a first dielectric layer, and a second dielectric layer as disclosed throughout this present disclosure. In an aspect, the dielectric materials may include a base material such as a fiberglass layer or a fabric layer reinforced with epoxy polymer resin. In another aspect, the dielectric materials may be a polyimide layer, a silicone layer, a polypropylene layer, a polyester layer, or a ceramic layer.

To improve the signal integrity and power integrity performance, according to the present disclosure, dielectric materials with different dielectric constant and loss tangent may be used in combinations by a designer to form "hybrid" structures. In an aspect, the first and second dielectric sublayers 102 and 103 may have a first dielectric constant ranging from approximately 3.1 to 3.5 and a first dielectric loss tangent ranging from approximately 0.006 to 0.0012. In an aspect, the first and second dielectric layers 104 and 105 may have a second dielectric constant ranging from approximately 3.5 to 4.2 and a second dielectric loss tangent ranging from approximately 0.0012 to 0.023, as shown in Table 1 below.

TABLE 1

| Descriptions | Dielectric Constant, $D_k$ Range | Dielectric Loss Tangent, $D_f$ Range |
| --- | --- | --- |
| 1st & 2nd dielectric sublayers | 3.1~3.5 | 0.006~0.012 |
| 1st dielectric layer | 3.5~4.2 | 0.012~0.023 |
| 2nd dielectric layer | 3.5~4.2 | 0.012~0.023 |

In the aspect of FIG. 1, the first dielectric sublayer 102, the embedded voltage reference plane 101, and the second dielectric sublayer 103 may have a combined thickness $d_1$, ranging from 30 μm to 100 μm. In an aspect, the embedded voltage reference plane 101 may be spaced apart from the first dielectric layer 104 by a first distance $s_1$ and spaced apart from the second dielectric layer 105 by a second distance $s_2$. To improve signal integrity and power integrity performance, according to the present disclosure, the distances $s_1$ and $s_2$ may be set to different values by a designer. In this aspect, $s_1$ is configured to be symmetrical with $s_2$, i.e., $s_1$ and $s_2$ are the same.

In another aspect, a thickness for the printed circuit board 100 may include a thickness $d_2$ between the first signal conductors 106 and the first ground plane 108, and a thickness $d_3$ between the second signal conductors 107 and the second ground plane 109. To improve signal integrity and power integrity performance, according to the present disclosure, the thicknesses $d_1$, $d_2$, and $d_3$ may be set to different values by a designer. In an aspect, the thicknesses $d_1$, $d_2$, and $d_3$ are approximately the same thickness in FIG. 1.

According to the present disclosure, an embedded voltage reference plane 101 may include a thin layer of copper that may be coupled to a ground reference voltage (Vss). In an aspect, an embedded voltage reference plane 101 may have a thickness ranging from 10 μm to 50 μm.

Figure 2:
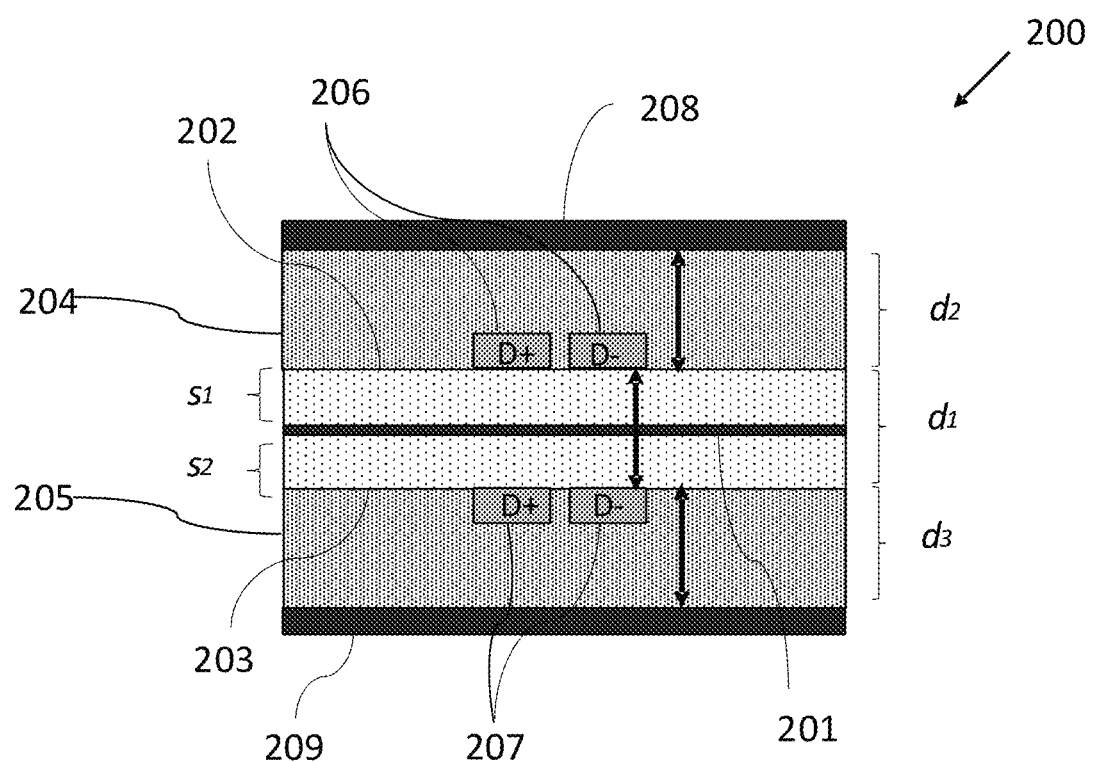
FIG. 2 shows a cross-section view of another exemplary interconnect stack with an embedded voltage reference plane according to the present disclosure.

FIG. 2 shows a cross-section view of another exemplary interconnect stack 200 with an embedded voltage reference plane 201 according to the present disclosure. The embedded conductive layer 201 may have a first dielectric sublayer 202 over a top surface and a second dielectric sublayer 203 under a bottom surface of the embedded voltage reference plane 201, which "embed" the conductive layer. According to the present disclosure, the combination of the first dielectric sublayer 202, the embedded voltage reference plane 201, and the second dielectric sublayer 203 constitute an intermediate layer. As shown in FIG. 2, the intermediate layer has a thickness $d_1$, with the first dielectric sublayer 202 having a thickness $s_1$ and the second dielectric sublayer 203 having a thickness $s_2$ that both contribute to the thickness $d_1$.

In this aspect shown in FIG. 2, a plurality of signal conductors 206 and 207 are disposed, respectively, on a top surface of the first dielectric sublayer 202 and under a bottom surface of the second dielectric sublayer 203. The first signal conductors 206 are covered by a first dielectric layer 204 positioned over the first dielectric sublayer 202 and the second signal conductors 207 are covered by a second dielectric layer 205 positioned under the second dielectric sublayer 203. In addition, a first ground (Vss) plane 208 may be disposed on a top surface of the first dielectric 204 and a second ground (Vss) plane 209 may be disposed under a bottom surface of the second dielectric 205.

In the aspect of FIG. 2, the first dielectric sublayer 202, the embedded voltage reference plane 201, and the second dielectric sublayer 203 may have a combined thickness $d_1$, ranging from 30 μm to 100 μm. In an aspect, the embedded voltage reference plane 201 may be spaced apart from the first dielectric layer by a first distance $s_1$ and spaced apart from the second dielectric layer 205 a second distance $s_2$. In one embodiment, $s_1$ is configured to be symmetrical with $s_2$, i.e., the distances $s_1$ and $s_2$ are the same.

In an aspect of the present disclosure, an embedded voltage reference plane 201 may have a thickness ranging from 10 μm to 50 μm. In another aspect, a thickness for the printed circuit board 200 may include a thickness $d_2$ between the first dielectric sublayer 202 and the first ground plane 208, and a thickness $d_3$ between the second dielectric sublayer 203 and the second ground plane 209. In a further aspect, the thicknesses $d_1$ $d_2$, and $d_3$ are approximately the same thickness. In an aspect, the dimensions in FIG. 1 and FIG. 2 may provide different options for adjusting the thicknesses for improving signal integrity performance e.g., by providing a shorter current return path for the plurality of signal conductors 106, 107, 206, and 207 through the embedded voltage reference planes 101 and 201 and device miniaturization according to the present disclosure.

Figure 3:
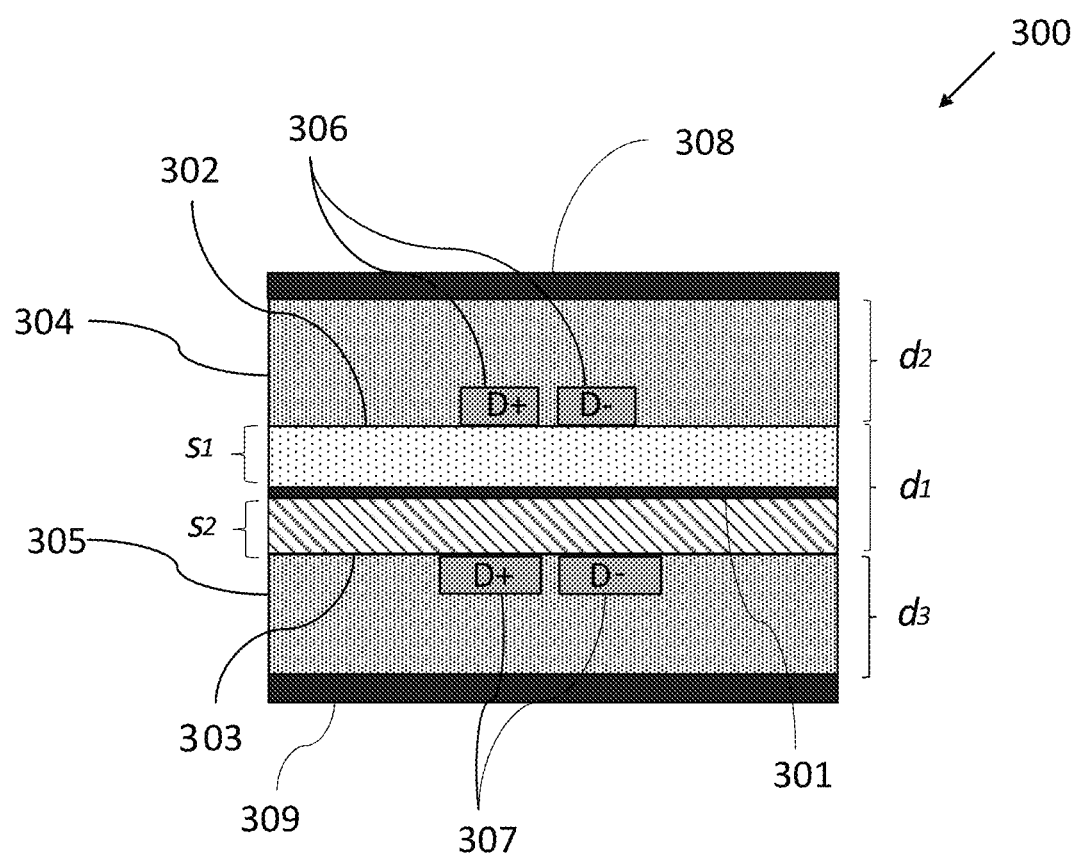
FIG. 3 shows a cross-section view of yet another exemplary interconnect stack with an embedded voltage reference plane according to the present disclosure.

In FIG. 3, an exemplary interconnect stack 300 may include an embedded voltage reference plane 301 positioned between a first dielectric sublayer 302 and a second dielectric sublayer 303. The first dielectric sublayer 302 and second dielectric sublayer may be made of different dielectric materials for configuring a hybrid dielectric interconnect for improved performance. According to the present disclosure, the combination of the first dielectric sublayer 302, the embedded voltage reference plane 301, and the second dielectric sublayer 303 constitute an intermediate layer. As shown in FIG. 3, the intermediate layer has a thickness $d_1$, with the first dielectric sublayer 302 having a thickness $s_1$ and the second dielectric sublayer 303 having a thickness $s_2$ that both contribute to the thickness $d_1$.

In the aspect shown in FIG. 3, a plurality of signal conductors 306 and 307 are disposed, respectively, on a top surface of the first dielectric sublayer 302 and under a bottom surface of the second dielectric sublayer 303. The first signal conductors 306 are covered by a first dielectric layer 304 positioned over the first dielectric sublayer 302 and the second signal conductors 307 are covered by a second dielectric layer 305 positioned under the second dielectric sublayer 303. In addition, a first ground (Vss) plane 308 may be disposed on a top surface of the first dielectric 304 and a second ground (Vss) plane 309 may be disposed under a bottom surface of the second dielectric 305.

In the aspect of FIG. 3, the first dielectric sublayer 302, the embedded voltage reference plane 301, and the second dielectric sublayer 303 may have a combined thickness $d_1$, ranging from approximately 30 μm to 100 μm. In an aspect, the embedded voltage reference plane 301 may be spaced apart from the first dielectric layer 304 by a first distance $s_1$ and spaced apart from the second dielectric layer 305 by a second distance $s_2$. In one embodiment, $s_1$ is configured to be symmetrical with $s_2$, i.e., the distances $s_1$ and $s_2$ are the same.

In an aspect of the present disclosure, an embedded voltage reference plane may have a thickness in the range from approximately 10 μm to 50 μm. In another aspect, a thickness for the printed circuit board 300 may include a thickness $d_2$ between the first dielectric sublayer 302 and the first ground plane 308, and a thickness $d_3$ between the second dielectric sublayer 303 and the second ground plane 309. In a further aspect, the thicknesses $d_1$ $d_2$, and $d_3$ are approximately the same thickness.

In this aspect, the first dielectric sublayer 302 may be made of a first dielectric material with a first dielectric constant ranging from approximately 3.1 to 3.5 and a first loss tangent ranging from approximately 0.006 to 0.0012, whereas the second dielectric sublayer 303 may be made of a second dielectric material with an ultra-low second dielectric constant ranging from approximately 2.8 to 3.1 and an ultra-low second loss tangent ranging from approximately 0.002 to 0.006. According to this aspect, the lower second dielectric constant and second loss tangent of the second dielectric material allows the second signal conductors 307 to be made wider (i.e., a greater cross-section) for improved signal integrity through reduced insertion loss.

In a further aspect, the first and second dielectric 304 and 305 may have a third dielectric constant ranging from approximately 3.5 to 4.2 and a third dielectric loss tangent ranging from approximately 0.0012 to 0.023, as shown in Table 2 below.

TABLE 2

| Descriptions | Dielectric Constant, $D_k$ Range | Dielectric Loss Tangent, $D_f$ Range |
| --- | --- | --- |
| 1st dielectric sublayer | 3.1~3.5 | 0.006~0.012 |
| 2nd dielectric sublayer | 2.8~3.1 | 0.002~0.006 |
| 1st & 2nd dielectric layers | 3.5~4.2 | 0.12~0.023 |

Figure 4:
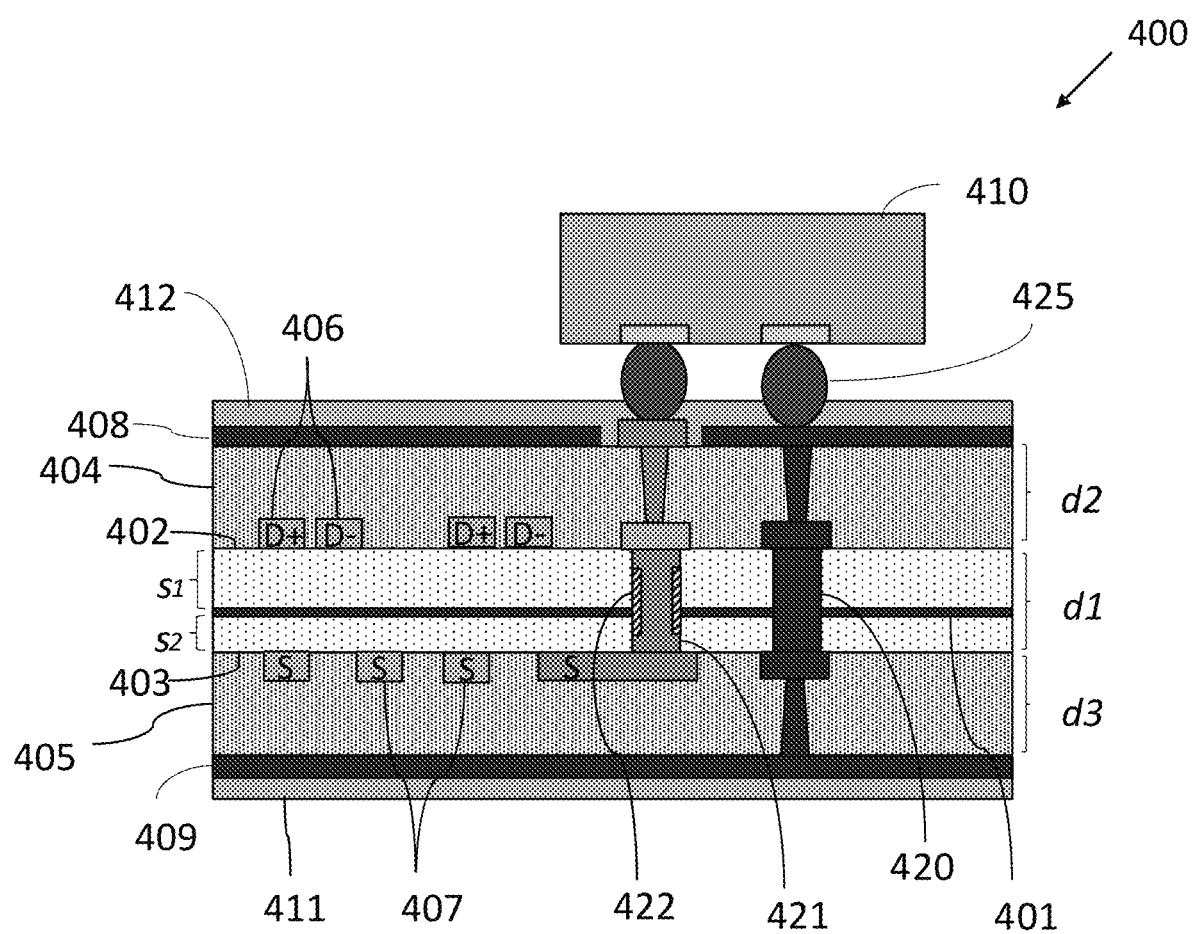
FIG. 4 shows a cross-section view of an exemplary interconnect stack with an embedded voltage reference plane and plated through hole vias according to the present disclosure

FIG. 4 shows a cross-section view of an exemplary printed circuit board 400 made with a hybrid dielectric interconnect stack with an embedded voltage reference plane 401 including plated through-hole via 420 and plated through-hole via 421, which may have a dielectric liner 422, according to the present disclosure. According to the present disclosure, a first dielectric sublayer 402, the embedded voltage reference plane 401 and the second dielectric sublayer 403 constitute an intermediate layer.

As shown in FIG. 4, a plurality of signal conductors 406, e.g., high-speed differential pair signal conductors, are disposed on a top surface of the first dielectric sublayer 402 and a plurality of signal lines 407 e.g., high-speed single-ended signal conductors, are position under a bottom surface of the second dielectric sublayer 403. The signal conductors 406 are covered by a first dielectric layer 404 positioned over the first dielectric sublayer 402 and the signal lines 407 are covered by a second dielectric layer 405 positioned under the second dielectric sublayer 403. In addition, a first ground (Vss) plane 408 may be disposed on a top surface of the first dielectric 404 to facilitate signal current return path and/or electromagnetic shielding and a second ground (Vss) plane 409 may be disposed under a bottom surface of the second dielectric 405 to facilitate signal current return path and/or electromagnetic shielding.

In the aspect of FIG. 4, the embedded voltage reference plane 401 may be spaced apart from the first dielectric layer 404 by a first distance $s_1$ and spaced apart from the second dielectric layer 405 a second distance $s_2$. In this aspect, $s_1$ is configured to be asymmetrical with $s_2$, i.e., the distances $s_1$ may be larger than $s_2$. In this aspect, the improved electrical performance of the signal conductors 406 through reduced insertion loss can be achieved through $s_1$ having a larger spacing. In this aspect, the improved electrical performance of the signal conductors 407 through reduced signal cross-talk coupling can be achieved through $s_2$ with a reduced spacing or shorter current return path.

In an aspect of the present disclosure, the first dielectric sublayer 402, the embedded voltage reference plane 401, and the second dielectric sublayer 403 may have a combined thickness $d_1$ in the ranging from approximately 30 μm to 100 μm, while the embedded voltage reference plane 401 may have a thickness ranging from 10 μm to 50 μm. In another aspect, a thickness for the printed circuit board 400 may include a thickness $d_2$ between the first dielectric sublayer 402 and the first ground plane 408, and a thickness $d_3$ between the second dielectric sublayer 403 and the second ground plane 409. In a further aspect, the thicknesses $d_1$ $d_2$, and $d_3$ are approximately the same thickness.

In an aspect, the printed circuit board 400 may have an electronic device 410, e.g., a central processing unit (CPU), a graphic processing unit (GPU), a memory device, a field programmable gate array (FPGA), a neural network accelerator, a platform controller hub or chipset coupled to the first ground (Vss) plane 408 coupled by solder balls 425 to the plated through hole vias 420 and 421. In another aspect, the electronic device 410 is a passive component e.g., a connector receptacle. In an aspect, the signal conductors 407 are coupled to the electronic device 410 through the plated through-hole via 421. In an aspect, the printed circuit board 400 may have a top solder resist layer 412 disposed on the first ground (Vss) plane 408 for electrical isolation. In an aspect, the printed circuit board 400 may have a bottom solder resist layer 411 disposed on the second ground (Vss) plane 409 for electrical isolation.

Figure 5:
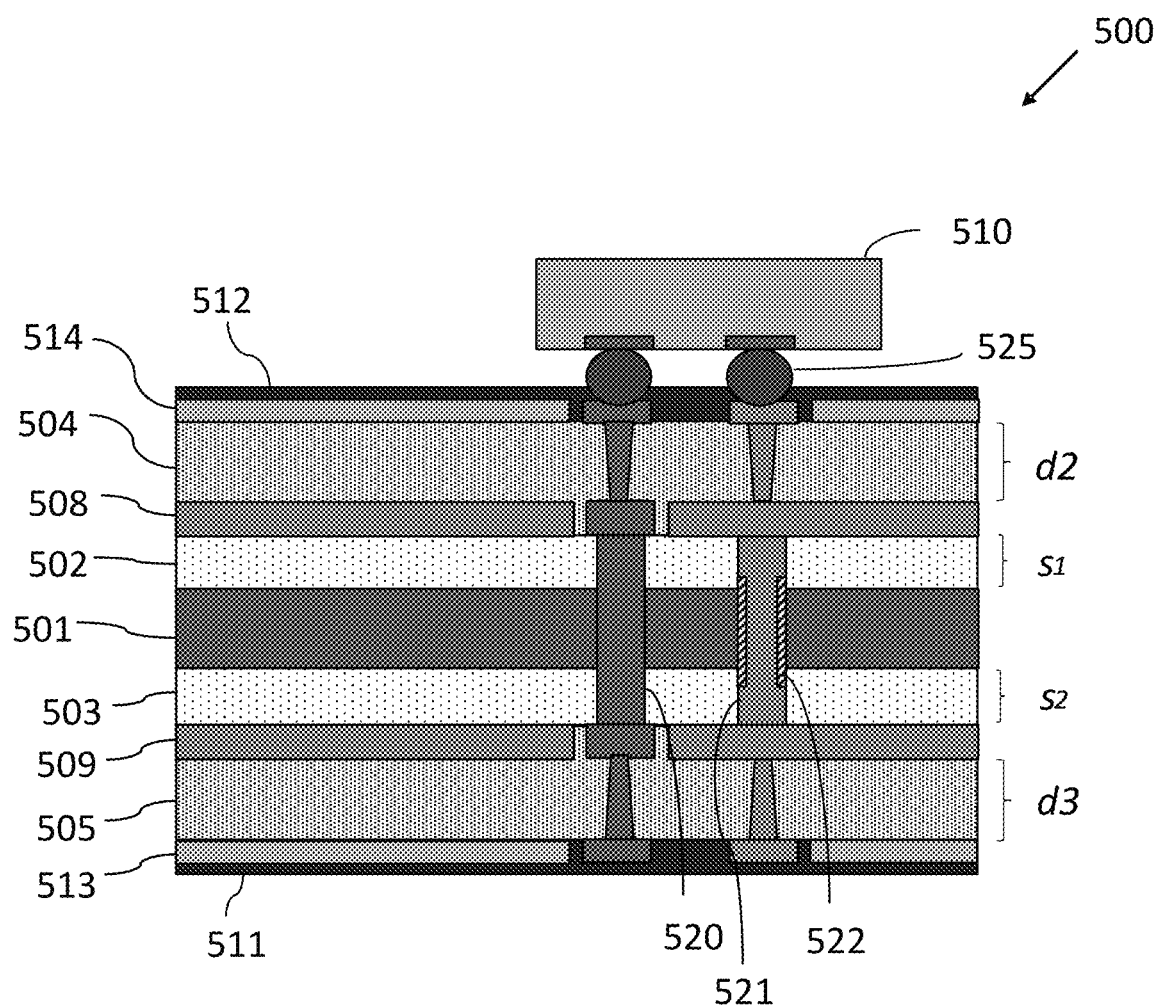
FIG. 5 shows a cross-section view of an exemplary interconnect stack with an embedded power supply plane according to the present disclosure.

FIG. 5 shows a cross-section view of an exemplary printed circuit board 500 having a hybrid interconnect stack with an embedded conductive layer, which may be a power supply reference 501 plane, according to the present disclosure. The power supply reference plane 501 may be positioned between first and second dielectric sublayers 502 and 503, for which the first and second dielectric sublayers 502 and 503 have low dielectric constants and low dielectric loss tangents for improved power integrity, e.g., improved impedance load lines and Vmin performance. In an embodiment, the power supply (Vcc) reference plane 501 may be a thicker copper layer, e.g., approximately 70 um to 90 um thick, to help reduce DC resistance and carry a large $ICC_{Max}$ load current.

According to the present disclosure, for example, an exemplary printed circuit board 500 may include a power supply reference plane 501 with a thickness of approximately 70 um, first and second dielectric sublayers 502 and 503 with thicknesses, $s_1$ and $s_2$, of approximately 50 um, sublayer ground reference planes 508 and 509 with a thickness of approximately 30 um, and first and second dielectric layers 504 and 505 with thicknesses, $d_2$, and $d_3$, of approximately 70 um.

In an aspect, the first and second dielectric sublayers 502 and 503 provide dielectric separation between the power supply (Vcc) reference plane 501 and the sublayer ground (Vss) reference planes 508 and 509, respectively, that may significantly reduce the AC loop inductance of decoupling capacitors mounted on the printed circuit board 500, which may greatly reduce peak resonance impedance. In a further aspect, the printed circuit board 500 may include first and second dielectric layers 504 and 505, top and bottom signal breakout layers 514 and 513, and top and bottom solder resist layers 512 and 511 as shown in FIG. 5.

In a further aspect, the printed circuit board 500 may have an electronic device 510 e.g., a central processing unit (CPU), a graphic processing unit (GPU), a memory device, a field programmable gate array (FPGA), a neural network accelerator, a platform controller hub or chipset coupled by solder balls 525 to the plated through-hole vias 520 and 521. In another aspect, the plated through hole via 521 may be connected to sublayer ground reference planes 508 and 509 and isolated from the power supply reference plane 501 by a dielectric liner 522, while the plated through hole via 520 may be directly connected to the power supply reference plane 501. In another aspect, the electronic device 510 is a passive component e.g., a decoupling capacitor, an inductor, a voltage regulator, or a resistor.

FIGS. 6A through 6L and 6L' show cross-section views for an exemplary process flow for making a printed circuit board 600, or other semiconductor substrates, with an embedded conductive layer 601 according to the present disclosure.

Figure 6A:
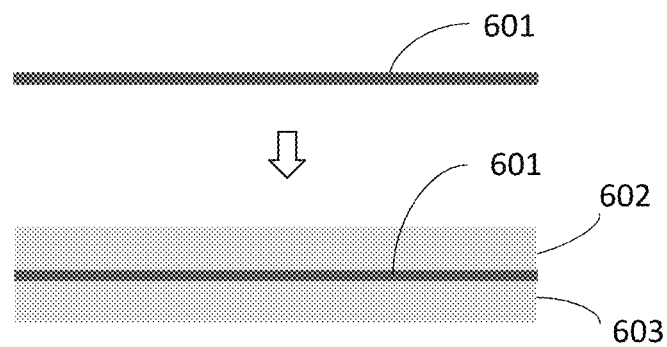

In FIG. 6A, according to the present disclosure, a conductive layer or metal foil 601 (e.g., a copper foil) may be encapsulated by dielectric layers 602 and 603 by a variety of conventional coating processes, including spray coating, screen and stencil printing, or film lamination processes. This forms an intermediate layer for building the printed circuit board 600.

Figure 6B:
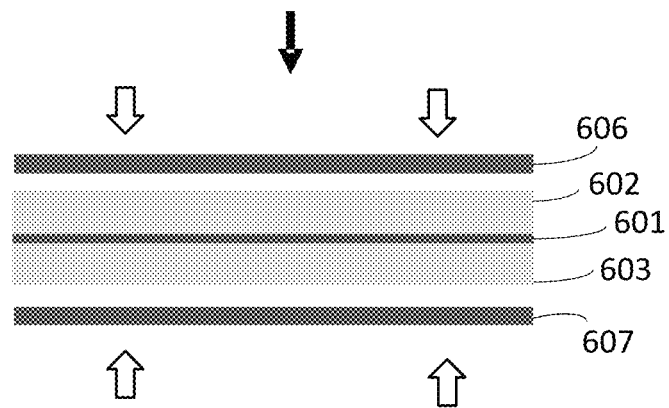

In FIG. 6B, according to the present disclosure, metal build-up layers 606 and 607 may be formed on the dielectric layers 602 and 603 using conventional deposition methods or by a hot-press lamination process as indicated by the arrows shown in the figure.

Figure 6C:
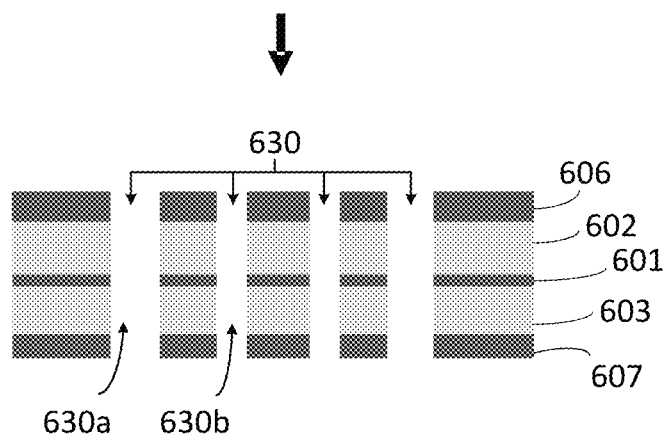

In FIG. 6C, according to the present disclosure, holes/openings 630 may be formed in the partial build hybrid interconnect stack using a laser or mechanical drilling processing step to remove portions of the metal layers 606, 601, and 607 and dielectric layers 602 and 603. The holes 630 may be used to form interconnect vias and plated through hole vias. In an aspect, holes 630a with a first diameter greater than holes 630b with a second diameter may be formed.

In FIG. 6D, according to the present disclosure, holes 630a may be selectively filled with a dielectric material to form plugs 631 using a variety of conventional deposition processes, including spray coating, stencil printing, and other dispensing processes for filling holes.

In FIG. 6E, according to the present disclosure, holes/openings 632 may be formed using a laser or mechanical drilling processing step to remove portions of the plugs 631 and leaving behind a hole liner 631a in the holes 630a.

In FIG. 6F, according to the present disclosure, a dielectric liner 622 may be formed using a laser or mechanical drilling processing step to remove the top and bottom portions of the hole liner 631a from the holes 630a. The shield liner 622 provides an electrical barrier or insulator for electrically connecting to the conductive layer 601.

Figure 6G:
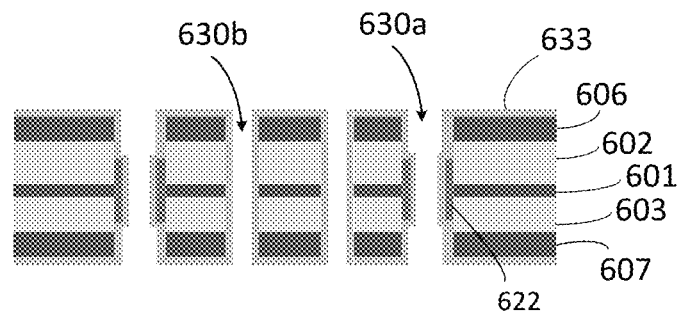

In FIG. 6G, according to the present disclosure, a metal seed layer 633 may be deposited on the surfaces of the holes 630a and 630b and the dielectric liners 622 using a deposition process, for example, copper deposition using an electroless plating process. An electroless process uses a chemical reducing agent within its solution chemistry which will result in nearly uniform deposition on all surfaces that are wetted by the chemistry.

Figure 6H:
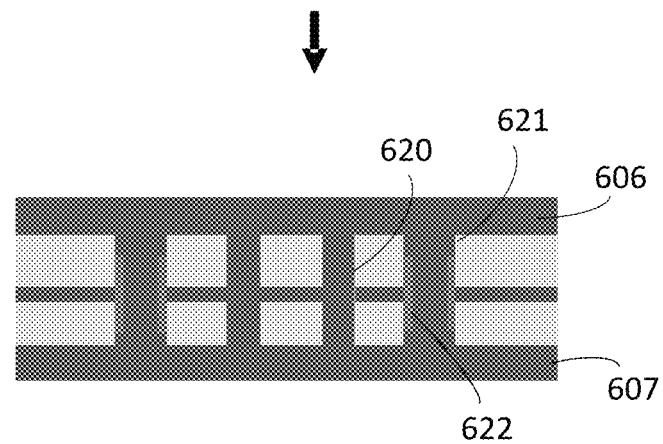

In FIG. 6H, according to the present disclosure, the openings 630a and 630b may be filled and the surfaces of metal layers 606 and 607 may be covered by depositing a conductive material; for example, copper deposition using an electrolytic plating process.

Figure 6I:
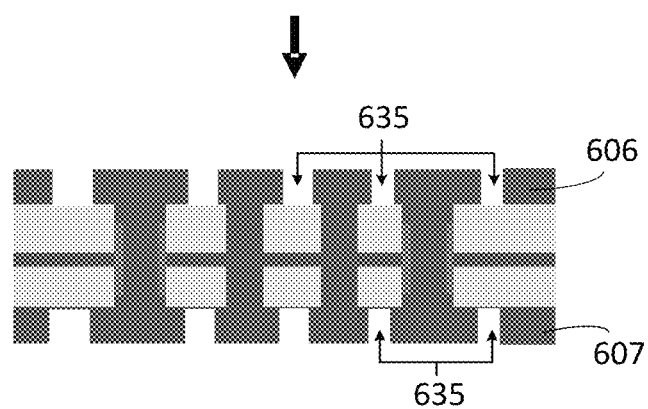

In FIG. 6I, according to the present disclosure, top and bottom openings 635 may be formed by a photolithography process, e.g., an ultra-violet (UV) photoresist development and a wet etching. It is also possible to use reactive ion etching to form the openings. The openings 635 may separate the metal layers 606 and 607 into contact pads and signal lines (not shown).

In FIG. 6J, according to the present disclosure, dielectric layers 604 and 605 may be formed on the intermediate layer by using conventional deposition methods or by a hot-press lamination process. Metal layers 608 and 609 may be formed on the dielectric layers 604 and 605 using conventional metal deposition processes, e.g., copper deposition using an electrolytic plating process, to form a printed circuit board 600.

In FIG. 6K, according to the present disclosure, a plurality of metal build-up layers may be added to the printed circuit board 600 by conventional process steps, including mechanical and laser drilling, hot-press lamination, plating, and etching. As part of the metallization process, a plurality of plated through hole vias 620 and a plurality of plated through hole vias 621 with dielectric liners 622 may be formed. The top and bottom openings 637 may separate the metal layers 608 and 609 into contact pads and signal lines.

Figure 6L:
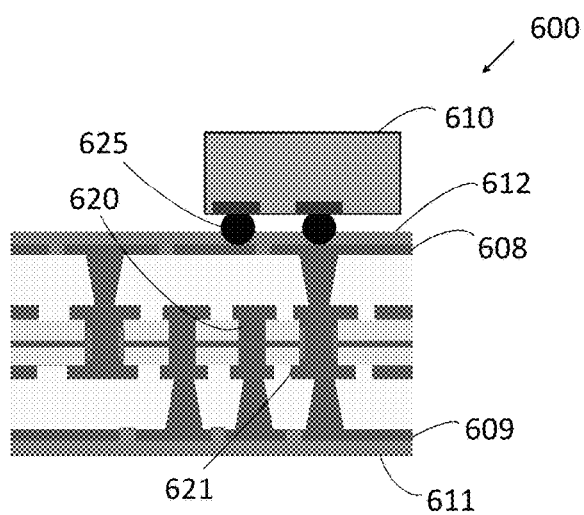
Figure 6L:
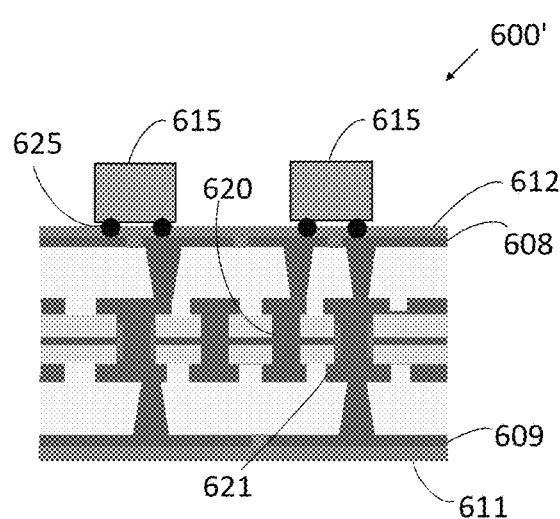

In FIG. 6L, according to the present disclosure, a semiconductor die or package 610 may be coupled via solder balls 625 to the printed circuit board 600 having resist layers 611 and 612 using conventional methods, including solder bonding, thermal compression bonding, or other surface mounting methods.

In FIG. 6K' according to a further aspect of the present disclosure, a different plurality of metal build-up layers may be added to the printed circuit board 600' by conventional process steps, including mechanical and laser drilling, hot-press lamination, plating, and etching. As part of the metallization process, a plurality of plated through hole vias 620 and a plurality of plated through hole vias 621 with dielectric liners 622 may be formed. The top and bottom openings 637 may separate the metal layers 608 and 609 into contact pads and signal lines.

In FIG. 6L', according to a further aspect of the present disclosure, passive devices 615 may be coupled via solder balls 625 to the printed circuit board 600 having resist layers 611 and 612 using conventional methods, including solder bonding, thermal compression bonding, or other surface mounting methods.

Figure 7:
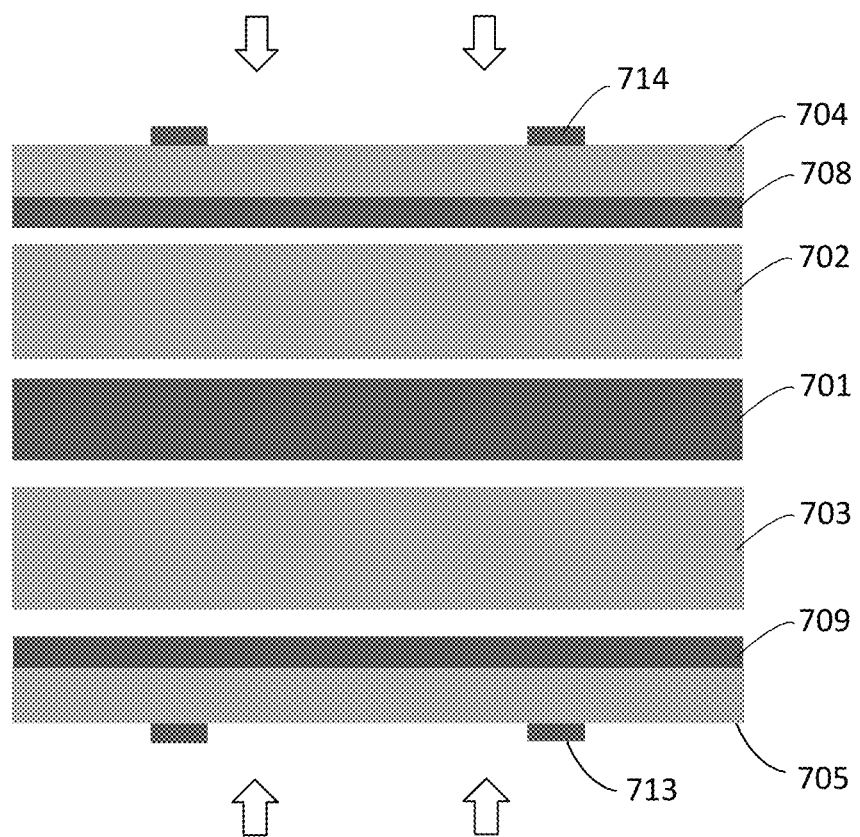
FIG. 7 shows an alternative exemplary process step according to an aspect of the present disclosure.

FIG. 7 shows an alternative exemplary process step according to an aspect of the present disclosure. A prepreg dielectric material and other preformed layers may be used for constructing a printed circuit board using hot press lamination, as indicated by the arrows shown in FIG. 7. An conductive layer 701, dielectric layers 702 and 703 (i.e., prepregs), and a preformed structure with layers 708, 704, and 714 at the top and another preformed structure with layers 709, 705, and 713 on the bottom may be hot press laminated together in a single step and followed by the forming of holes for vias and metallization build-up to complete the print circuit board.

Figure 8:
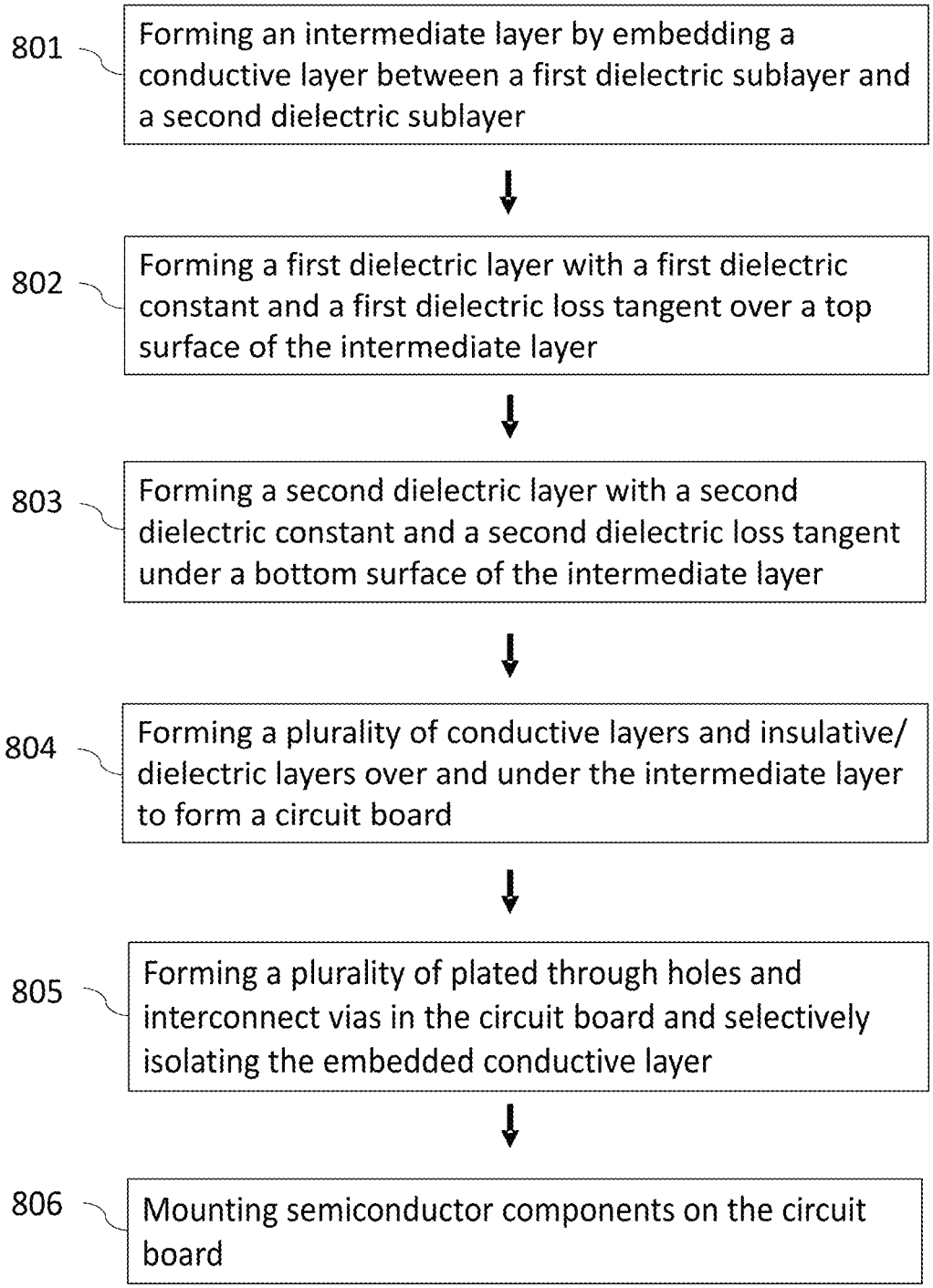
FIG. 8 a simplified flow diagram for an exemplary method according to aspects of the present disclosure encompassing the assembly process for a present printed circuit board.

FIG. 8 shows a simplified flow diagram for an exemplary method according to aspects of the present disclosure encompassing the assembly process for a present printed circuit board.

The operation 801 may be directed to forming an intermediate layer by embedding a conductive layer between a first dielectric sublayer and a second dielectric sublayer.

The operation 802 may be directed to forming a first dielectric layer with a first dielectric constant and a first dielectric loss tangent over a top surface of the intermediate layer.

The operation 803 may be directed to forming a second dielectric layer with a second dielectric constant and a second dielectric loss tangent under a bottom surface of the intermediate layer.

The operation 804 may be directed to forming a plurality of conductive layers and insulative/dielectric layers over and under the intermediate layer to form a printed circuit board.

The operation 805 may be directed to forming a plurality of plated through hole vias and interconnect vias in the printed circuit board, and selectively isolating the embedded conductive layer.

The operation 806 may be directed to mounting semiconductor components on the printed circuit board.

Figure 9:
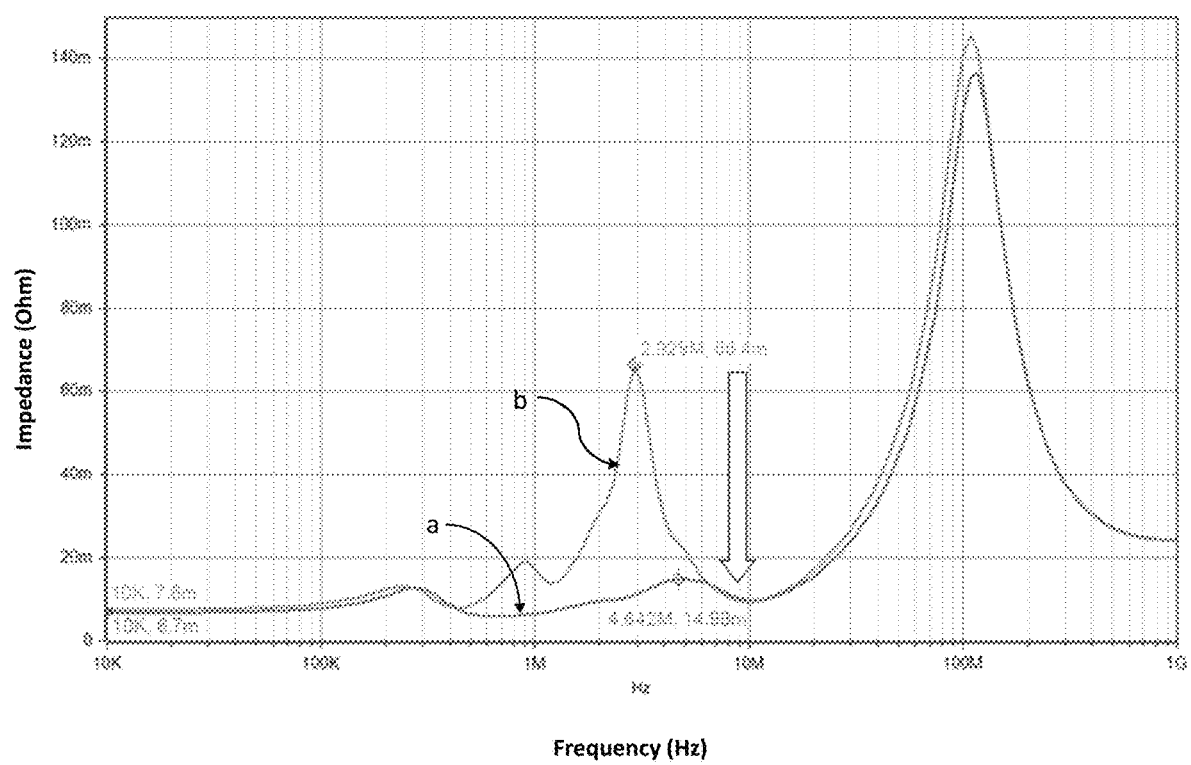
FIG. 9 shows a graphical comparison between a present printed circuit board using hybrid dielectric interconnect and a convention 4-layer printed circuit board according to an aspect of the present disclosure.

FIG. 9 shows a graphical comparison between a present printed circuit board using a hybrid dielectric interconnect (curve a) and a convention 4-layer printed circuit board (curve b) according to an aspect of the present disclosure. As shown in FIG. 9, the present hybrid dielectric interconnect stack with an embedded conductive layer, as used in a PCB, provides impedance reduction (i.e., through reduced AC loop inductance) that improves power integrity performance in a range of up to seventy-five percent (75%) for LL2 peak resonance impedance. There is also a ten-percent (10%) reduction on low-frequency impedance below 10 kHz.

Figure 10:
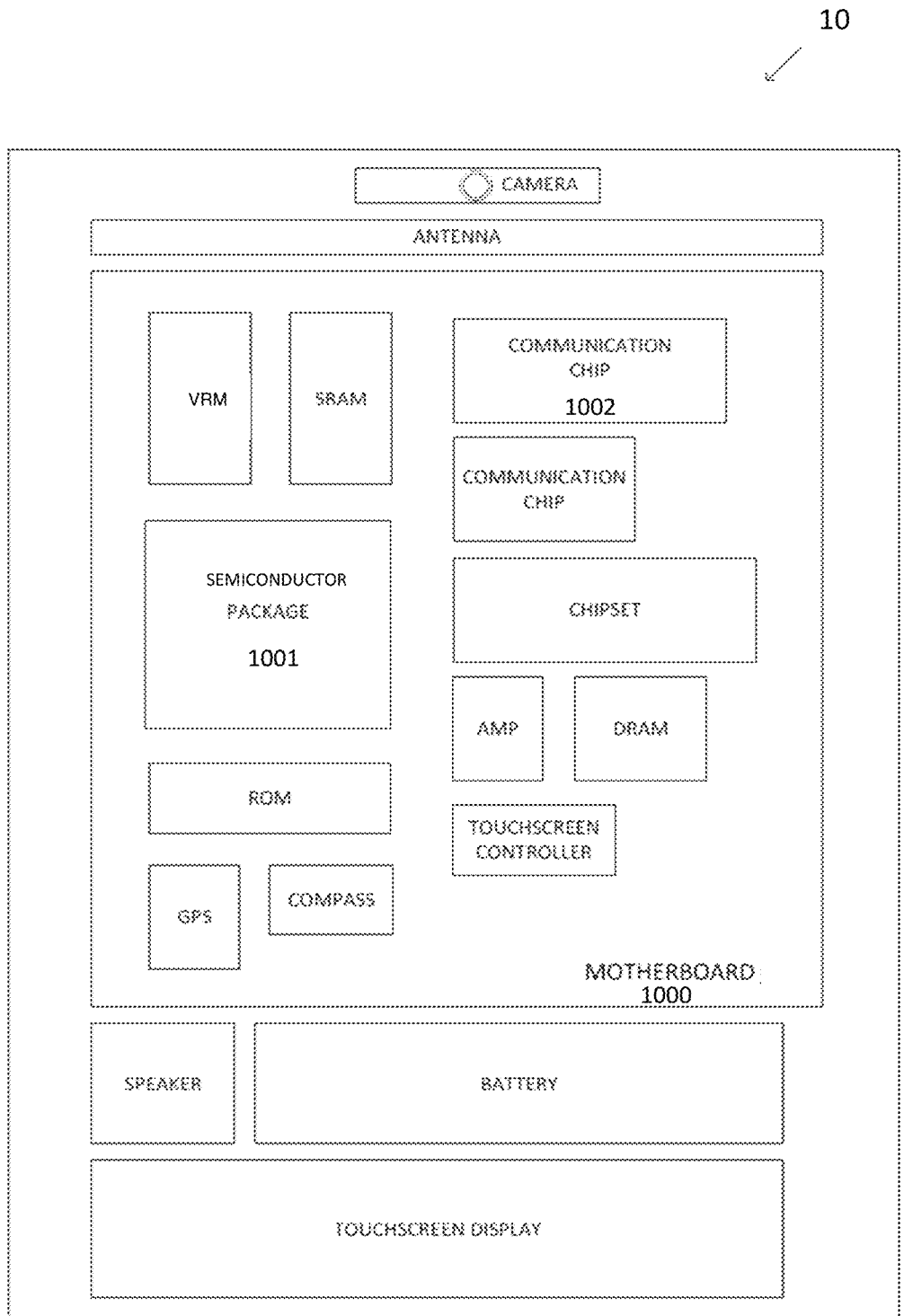
FIG. 10 shows an illustration of a computing device that includes an interconnect stack with an embedded conductive layer according to a further aspect of the present disclosure.

In another aspect, as shown in FIG. 10, the computing device 10 may house a board such as a motherboard 1000. The present hybrid dielectric interconnect stack, according to the present disclosure, may be incorporated as part of the motherboard 1000. The motherboard 1000 may include a number of components, including, but not limited to, a semiconductor package 1001 and at least one communication chip 1002. In some implementations, the at least one communication chip 1002 may also be physically and electrically coupled to the motherboard 1000. In further implementations, the communication chip 1002 may be part of the semiconductor package 1001.

Depending on its applications, computing device 10 may include other components that may or may not be physically and electrically coupled to the motherboard 1000. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 1002 may enable wireless communications for the transfer of data to and from the computing device 10. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some aspects they might not. The communication chip 1002 may implement any of a number of wireless standards or protocols, including but not limited to Institute for Electrical and Electronics Engineers (IEEE) standards including Wi-Fi (IEEE 1002.11 family), IEEE 1002.16 standards (e.g., IEEE 1002.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 1002.16 compatible BWA networks are generally referred to as WiMAX networks, an acronym that stands for Worldwide Interoperability for Microwave Access, which is a certification mark for products that pass conformity and interoperability tests for the IEEE 1002.16 standards.

The communication chip 1002 may also operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1002 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1002 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1002 may operate in accordance with other wireless protocols in other aspects.

The computing device 10 may include a plurality of communication chips 1002. For instance, a first communication chip 1002 may be dedicated to shorter range wireless communications such as Wi-Fi and Bluetooth, and a second communication chip 1002 may be dedicated to longer range wireless communications such as GPS, EDGE, GPRS, CDMA, WiMAX, LTE, Ev-DO, and others.

In various implementations, the computing device 10 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In an aspect, the computing device 10 may be a mobile computing device. In further implementations, the computing device 10 may be any other electronic device that processes data.

To more readily understand and put into practical effect the present method and device for, particular aspects will now be described by way of examples. For the sake of brevity, duplicate descriptions of features and properties may be omitted.

EXAMPLES

Example 1 provides an interconnect including a first dielectric layer with a first dielectric constant and a first dielectric loss tangent, an intermediate layer including a first dielectric sublayer with a first sublayer dielectric constant and a first sublayer dielectric loss tangent, an embedded conductive layer, and a second dielectric sublayer with a second sublayer dielectric constant and a second sublayer dielectric loss tangent, in which the embedded conductive layer is positioned between the first and second dielectric sublayers.

Example 2 may include the interconnect of example 1 and/or any other example disclosed herein, including a second dielectric layer with a second dielectric constant and a second dielectric loss tangent, in which the intermediate layer is positioned between the first and second dielectric layers, and a first conductive signal line at a top surface of the intermediate layer, in which the conductive signal line is covered by the first dielectric layer, and a second conductive signal line at a bottom surface of the intermediate layer, in which the second conductive line is covered by the second dielectric layer, and in which the first sublayer dielectric constant and the first sublayer dielectric loss tangent of the first dielectric sublayer and the second sublayer dielectric constant and the second sublayer dielectric loss tangent of the second dielectric sublayer being lower in value than the first dielectric constant and the first dielectric loss tangent of the first dielectric layer and the second dielectric constant and the second dielectric loss tangent of the second dielectric layer.

Example 3 may include the interconnect of example 2 and/or any other example disclosed herein, in which the first dielectric sublayer further comprises a first dielectric material and the second dielectric sublayer further comprises a second dielectric material and the first sublayer dielectric constant, and the first sublayer dielectric loss tangent of the first dielectric material is different from the second sublayer dielectric constant and the second sublayer dielectric loss tangent of the second dielectric material.

Example 4 may include the interconnect of example 1 and/or any other example disclosed herein, in which the embedded conductive layer is a voltage reference plane.

Example 5 may include the interconnect of example 2 and/or any other example disclosed herein, in which the first dielectric layer, the intermediate layer, and the second dielectric layer are approximately the same thickness.

Example 6 may include the interconnect of example 2 and/or any other example disclosed herein, further including a first ground plane positioned above the first dielectric layer, and a second ground plane positioned below the second dielectric layer.

Example 7 may include the interconnect of example 6 and/or any other example disclosed herein, in which the first dielectric layer between the first conductive line and first ground plane, the intermediate dielectric layer, and the second dielectric layer between the second conductive line and second ground plane are all of approximately the same thickness.

Example 8 may include the interconnect of example 6 and/or any other example disclosed herein, in which the embedded conductive layer is a ground reference plane, and the interconnect further including a first plated through-hole via positioned through the intermediate layer, wherein the first plated through-hole via connects a semiconductor component positioned on a circuit board to the ground reference plane and wherein the first plated through-hole via is coupled to the first and second ground planes.

Example 9 may include the interconnect of example 8 and/or any other example disclosed herein, further including a second plated through-hole via positioned through the intermediate layer, wherein the second plated through-hole via connects a die positioned on the circuit board to the second conductive signal line and wherein the second plated through-hole via is spaced apart from the ground reference plane.

Example 10 may include the interconnect of example 1 and/or any other example disclosed herein, in which the first dielectric sublayer and the second dielectric sublayer are different thicknesses.

Example 11 may include the interconnect of example 1 and/or any other example disclosed herein, including a second dielectric layer with a second dielectric constant and a second dielectric loss tangent, in which the intermediate layer is positioned between the first and second dielectric layers, and a first sublayer ground plane positioned above the first dielectric sublayer; and a second sublayer ground plane positioned below the second dielectric sublayer, wherein the embedded conductive layer is a power supply plane.

Example 12 may include the interconnect of example 11 and/or any other example disclosed herein, including the power supply reference plane with a thickness in the range of approximately 70 um to 90 um.

Example 13 may include the interconnect of example 11 and/or any other example disclosed herein, including a first plated through-hole via positioned through the intermediate layer, wherein the first plated through-hole via connects a semiconductor component positioned on a circuit board to the power supply plane and wherein the first plated through-hole via is spaced apart from the first and second sublayer ground planes.

Example 14 may include the interconnect of example 13 and/or any other example disclosed herein, including a second plated through-hole via positioned through the intermediate layer, in which the second plated through-hole via connects a die positioned on the circuit board to the first and second sublayer ground planes and in which the second plated through-hole via is spaced apart from the power supply plane.

Example 15 provides a method including forming a circuit board with an interconnect includes forming an intermediate layer, the intermediate layer includes embedding a conductive layer between a first dielectric sublayer with a first sublayer dielectric constant and a first sublayer dielectric loss tangent and a second dielectric sublayer with a second sublayer dielectric constant and a second sublayer dielectric loss tangent, forming a first dielectric layer with a first dielectric constant and a first dielectric loss tangent and a second dielectric layer with a second dielectric constant and a second dielectric loss tangent, in which the intermediate layer is positioned between the first and second dielectric layers, and mounting at least one semiconductor component on the printed circuit board.

Example 16 may include the method of example 15 and/or any other example disclosed herein, including at least one of the first sublayer dielectric constant and the first sublayer dielectric loss tangent of the first dielectric sublayer and the second sublayer dielectric constant, and the second sublayer dielectric loss tangent of the second dielectric sublayer being lower in value than the first dielectric constant and the first dielectric loss tangent of the first dielectric layer and the second dielectric constant and the second dielectric loss tangent of the second dielectric layer.

Example 17 may include the method of example 15 and/or any other example disclosed herein, in which the embedded conductive layer is configured to a ground reference voltage (Vss) or a power supply reference voltage (Vcc).

Example 18 provides for a device including a circuit board including a first dielectric layer with a first dielectric constant and a first dielectric loss tangent, an intermediate layer including a first dielectric sublayer with a first sublayer dielectric constant and a first sublayer dielectric loss tangent, an embedded conductive layer, and a second dielectric sublayer with a second sublayer dielectric constant and a second sublayer dielectric loss tangent, in which the embedded conductive layer is positioned between the first and second dielectric sublayers, and a second dielectric layer with a second dielectric constant and a second dielectric loss tangent, in which the intermediate layer is positioned between the first and second dielectric layers, and a plurality of semiconductor components on the circuit board.

Example 19 may include the method of example 18 and/or any other example disclosed herein, including at least one of the first sublayer dielectric constant and the first sublayer dielectric loss tangent of the first dielectric sublayer and the second sublayer dielectric constant, and the second sublayer dielectric loss tangent of the second dielectric sublayer being lower in value than the first dielectric constant and the first dielectric loss tangent of the first dielectric layer and the second dielectric constant and the second dielectric loss tangent of the second dielectric layer.

Example 20 may include the method of example 18 and/or any other example disclosed herein, in which the embedded conductive layer is a ground (Vss) reference plane or a power supply (Vcc) reference plane.

It will be understood that any property described herein for a specific device may also hold for any device described herein. It will also be understood that any property described herein for a specific method may hold for any of the methods described herein. Furthermore, it will be understood that for any device or method described herein, not necessarily all the components or operations described will be enclosed in the device or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled, as thermally coupled, and/or as mechanically coupled, e.g., attached or fixed or attached, or just in contact without any fixation, and it will be understood that both direct coupling or indirect coupling (in other words: coupling without direct contact) may be provided.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. A interconnect stack comprising:
a first dielectric layer with a first dielectric constant and a first dielectric loss tangent;
an intermediate layer comprising:
a first dielectric sublayer with a first sublayer dielectric constant and a first sublayer dielectric loss tangent;
an embedded conductive layer;
a second dielectric sublayer with a second sublayer dielectric constant and a second sublayer dielectric loss tangent, wherein the embedded conductive layer is positioned between the first and second dielectric sublayers; and
a second dielectric layer with a second dielectric constant and a second dielectric loss tangent, wherein the intermediate layer is positioned between the first and second dielectric layers;
wherein the first dielectric layer, first dielectric sublayer, second dielectric layer, and the second dielectric sublayer have different dielectric constants and dielectric loss tangents to form a hybrid structure.

2. The interconnect stack of claim 1, further comprising:
a first conductive signal line at a top surface of the intermediate layer, wherein the conductive signal line is covered by the first dielectric layer; and
a second conductive signal line at a bottom surface of the intermediate layer, wherein the second conductive signal line is covered by the second dielectric layer,
wherein at least one of the first sublayer dielectric constant and the first sublayer dielectric loss tangent of the first dielectric sublayer and the second sublayer dielectric constant and the second sublayer dielectric loss tangent of the second dielectric sublayer being lower in value than the first dielectric constant and the first dielectric loss tangent of the first dielectric layer and the second dielectric constant and the second dielectric loss tangent of the second dielectric layer.

3. The interconnect stack of claim 2, wherein the first dielectric sublayer further comprises a first dielectric material and the second dielectric sublayer further comprises a second dielectric material, and the first sublayer dielectric constant and the first sublayer dielectric loss tangent of the first dielectric material is different from the second sublayer dielectric constant and the second sublayer dielectric loss tangent of the second dielectric material.

4. The interconnect stack of claim 1, wherein the embedded conductive layer is a voltage reference plane.

5. The interconnect stack of claim 2, wherein the first dielectric layer, the intermediate layer, and the second dielectric layer are approximately the same thickness.

6. The interconnect stack of claim 2, wherein the conductive signal line is a first conductive signal line, and the interconnect stack further comprising:
a first ground plane positioned above the first dielectric layer; and
a second ground plane positioned below the second dielectric layer.

7. The interconnect stack of claim 6, wherein the first dielectric layer between the first conductive line and first ground plane, the intermediate dielectric layer, and the second dielectric layer between the second conductive line and second ground plane are approximately the same thickness.

8. The interconnect stack of claim 6, wherein the embedded conductive layer is a ground reference plane, and the interconnect stack further comprising:
a first plated through-hole via positioned through the intermediate layer, wherein the first plated through-hole via connects a semiconductor component positioned on a circuit board to the ground reference plane and wherein the first plated through-hole via is coupled to the first and second ground planes.

9. The interconnect stack of claim 8, further comprising:
a second plated through-hole via positioned through the intermediate layer, wherein the second plated through-hole via connects a die positioned on the circuit board to the second conductive signal line and wherein the second plated through-hole via is spaced apart from the ground reference plane.

10. The interconnect stack of claim 1, wherein the first dielectric sublayer and the second dielectric sublayer are different thicknesses.

11. The interconnect stack of claim 1, further comprising:
a second dielectric layer with a second dielectric constant and a second dielectric loss tangent, wherein the intermediate layer is positioned between the first and second dielectric layers;
a first sublayer ground plane positioned above the first dielectric sublayer; and
a second sublayer ground plane positioned below the second dielectric sublayer, wherein the embedded conductive layer is a power supply reference plane.

12. The interconnect stack of claim 11, further comprising the power supply reference plane with a thickness in the range of approximately 70 μm to 90 μm.

13. The interconnect stack of claim 11, further comprising:
a first plated through-hole via positioned through the intermediate layer, wherein the first plated through-hole via connects a semiconductor component positioned on a circuit board to the power supply reference plane and wherein the first plated through-hole via is spaced apart from the first and second sublayer ground planes.

14. The interconnect stack of claim 13, further comprising:
a second plated through-hole via positioned through the intermediate layer, wherein the second plated through-hole via connects a die positioned on the circuit board to the first and second sublayer ground planes and wherein the second plated through-hole via is spaced apart from the power supply reference plane.

15. A method comprising:
forming a circuit board with an interconnect stack comprising:
forming an intermediate layer comprising:
embedding a conductive layer between a first dielectric sublayer with a first sublayer dielectric constant and a first sublayer dielectric loss tangent and a second dielectric sublayer with a second sublayer dielectric constant and a second sublayer dielectric loss tangent;
forming a first dielectric layer with a first dielectric constant and a first dielectric loss tangent
forming a second dielectric layer with a second dielectric constant and a second dielectric loss tangent, wherein the intermediate layer is positioned between the first and second dielectric layers,
wherein the first dielectric layer, first dielectric sublayer, second dielectric layer, and the second dielectric sublayer have different dielectric constants and dielectric loss tangents to form a hybrid structure; and
mounting at least one semiconductor component on the printed circuit board.

16. The method of claim 15, further comprising
forming a first conductive signal line at a top surface of the intermediate layer, wherein the conductive signal line is covered by the first dielectric layer; and
forming a second conductive signal line at a bottom surface of the intermediate layer, wherein the second conductive signal line is covered by the second dielectric layer; and wherein at least one of the first sublayer dielectric constant and the first sublayer dielectric loss tangent of the first dielectric sublayer and the second sublayer dielectric constant and the second sublayer dielectric loss tangent of the second dielectric sublayer being lower in value than the first dielectric constant and the first dielectric loss tangent of the first dielectric layer and the second dielectric constant and the second dielectric loss tangent of the second dielectric layer.

17. The method of claim 15, wherein the embedded conductive layer is configured to a ground reference voltage (Vss) or a power supply reference voltage (Vcc).

18. A device comprising:
a circuit board comprising:
a first dielectric layer with a first dielectric constant and a first dielectric loss tangent;
an intermediate layer comprising:
a first dielectric sublayer with a first sublayer dielectric constant and a first sublayer dielectric loss tangent;
an embedded conductive layer; and
a second dielectric sublayer with a second sublayer dielectric constant and a second sublayer dielectric loss tangent, wherein the embedded conductive layer is positioned between the first and second dielectric sublayers; and
a second dielectric layer with a second dielectric constant and a second dielectric loss tangent, wherein the intermediate layer is positioned between the first and second dielectric layers, and wherein the first dielectric layer, first dielectric sublayer, second dielectric layer, and the second dielectric sublayer have different dielectric constants and dielectric loss tangents to form a hybrid structure; and
a plurality of semiconductor components on the circuit board.

19. The device of claim 18, further comprising
a first conductive signal line at a top surface of the intermediate layer, wherein the conductive signal line is covered by the first dielectric layer; and
a second conductive signal line at a bottom surface of the intermediate layer,
wherein the second conductive signal line is covered by the second dielectric layer, and wherein at least one of the first sublayer dielectric constant and the first sublayer dielectric loss tangent of the first dielectric sublayer and the second sublayer dielectric constant and the second sublayer dielectric loss tangent of the second dielectric sublayer being lower in value than the first dielectric constant and the first dielectric loss tangent of the first dielectric layer and the second dielectric constant and the second dielectric loss tangent of the second dielectric layer.

20. The device of claim 18, wherein the embedded conductive layer is a ground (Vss) reference plane or a power supply (Vcc) reference plane.

* * * * *